(12) United States Patent
Villien

(10) Patent No.: US 11,519,730 B2
(45) Date of Patent: Dec. 6, 2022

(54) METHOD FOR DETERMINING THE POSITION AND ORIENTATION OF A VEHICLE

(71) Applicant: Commissariat a l'energie atomique et aux energies alternatives, Paris (FR)

(72) Inventor: Christophe Villien, Grenoble (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 229 days.

(21) Appl. No.: 16/845,144

(22) Filed: Apr. 10, 2020

(65) Prior Publication Data

US 2020/0326189 A1 Oct. 15, 2020

(30) Foreign Application Priority Data

Apr. 15, 2019 (FR) ...................................... 19 04015

(51) Int. Cl.
*G01C 21/16* (2006.01)
*G01S 19/47* (2010.01)

(52) U.S. Cl.
CPC ............ *G01C 21/165* (2013.01); *G01S 19/47* (2013.01)

(58) Field of Classification Search
CPC .... G01R 33/00; G01R 33/02; G01R 33/0213; G01R 33/0022; G01R 33/0023;
(Continued)

(56) References Cited

U.S. PATENT DOCUMENTS

2004/0123474 A1* 7/2004 Manfred ................ G01C 17/38
33/352
2007/0213889 A1 9/2007 Parra-Carque
(Continued)

FOREIGN PATENT DOCUMENTS

EP 1 719 975 A1 11/2006
EP 3 276 302 A1 1/2018
WO WO2014/134710 A1 9/2014

OTHER PUBLICATIONS

French Search Report dated Jan. 30, 2020 in French Patent Application No. 1904015, 12 pages.
(Continued)

*Primary Examiner* — Christian Chace
*Assistant Examiner* — Jordan S Fei
(74) *Attorney, Agent, or Firm* — Oblon, McClelland, Maier & Neustadt, L.L.P.

(57) ABSTRACT

A method for determining the position and orientation of a vehicle, this method including measuring, with a magnetometer, a raw-measurement vector; obtaining a reference vector encoding, in a terrestrial reference frame, the amplitude and the direction of the geomagnetic field, the components of the reference vector being obtained from a pre-recorded model of the geomagnetic field and not measured by the magnetometer; then only if the margin of error in an estimate of the orientation of the vehicle is below a predetermined threshold, updating the pre-recorded data from which scale and offset coefficients used for correcting the raw measurement from the magnetometer are obtained, this update being performed using the raw vector, the reference vector and the new estimate of the orientation of the vehicle.

10 Claims, 3 Drawing Sheets

(58) Field of Classification Search
CPC .......... G01R 33/0029; G01R 33/0082; G01R 33/025; G01R 33/028; G01R 33/0206; G01C 21/16; G01C 25/00; G01C 17/38; G01C 21/165; G01C 21/1652; G01C 21/1654; G01C 21/1656; G01C 21/166; G01C 21/18; G01C 21/183; G01C 21/185; G01C 21/188; G01C 25/005; G01S 19/47; B64C 2201/141

See application file for complete search history.

(56) References Cited

U.S. PATENT DOCUMENTS

| | | | |
|---|---|---|---|
| 2008/0281555 A1* | 11/2008 | Godin | G01C 25/00 702/153 |
| 2011/0238307 A1* | 9/2011 | Psiaki | G01C 21/28 701/469 |
| 2011/0238308 A1 | 9/2011 | Miller et al. | |
| 2014/0232592 A1 | 8/2014 | Psiaki et al. | |
| 2014/0361763 A1* | 12/2014 | Chow | G01C 17/38 324/202 |
| 2015/0354980 A1 | 12/2015 | Wahdan et al. | |
| 2019/0195907 A1* | 6/2019 | Nomura | G01R 33/0035 |

OTHER PUBLICATIONS

Caruso, M.J., "Applications of Magnetoresistive Sensors in Navigation Systems", Honeywell Inc., 1997, 7 pages.

Foster, C.C., et al., "Extension of a Two-Step Calibration Methodology to Include Nonorthogonal Sensor Axes", IEEE Transactions on Aerospace and Electronic Systems, vol. 44 no. 3, Jul. 2008, pp. 1070-1078.

Gebre-Egziabher, D., et al., "Calibration of Strapdown Magnetometers in the Magnetic field Domain", Retrieved from the internet:: https://users.soe.ucsc.edu/~elkaim/Documents/magcal.pdf, 2006, 45 pages.

Groves, P.D., Principles of GNSS, Inertial, and Multisensor Integrated Navigation Systems, Second Edition (GNSS Technology and Applications, Chapter 5.6: Initialization and Alignment, 2008, pp. 195-203.

Groves, P.D., Principles of GNSS, Inertial, and Multisensor Integrated Navigation Systems, Second Edition (GNSS Technology and Applications, Chapter 15: INS Alignment, Zero Updates, and Motion Constraints, 2008, pp. 627-637.

Hajiyev, C., "Orbital Calibration of Microsatellite Magnetometers using a Linear Kalman Filter", Measurement Techniques, vol. 58, No. 9, Dec. 2015, pp. 1037-1043.

Hajiyev, C., "In-orbit magnetometer bias and scale factor calibration", Int. J. Metrol. Qual. Eng. vol. 7, 2016, pp. 104-104p7.

Li, W., et al., "Effective Adaptive Kalman Filter for MEMS-IMU/Magnetometers Integrated Attitude and Heading Reference Systems", The Journal of Navigation, vol. 66, 2013, pp. 99-113.

Olivares, A., et al., "Automatic Determination of Validity of Input Data Used in Ellipsoid Fitting MARG Calibration Algorithms", Sensors, vol. 13, 2013, pp. 11797-11817.

Renaudin, V., et al., "Complete Triaxis Magnetometer Calibration in the Magnetic Domain", Journal of Sensors, vol. 2010, pp. 1-10 with cover page.

Soken, H. E., "A Survey of calibration algorithms for small satellite magnetometers", Measurement, 2017, pp. 1-7.

Wu, Y., et al., "On Calibration of Three-axis Magnetometer", School of Electronic Information and Electrical Engineering, 2015, pp. 1-13.

Yang, D., "Complete Tri-Axis Magnetometer Calibration with a Gryo Auxiliary", Sensors, vol. 17, 2017, pp. 1-21.

\* cited by examiner

METHOD FOR DETERMINING THE POSITION AND ORIENTATION OF A VEHICLE

The invention relates to a method and system for determining the position and orientation of a vehicle. Another subject of the invention is a method and module for calibrating a magnetometer for implementing the method for determining the position and orientation of the vehicle. A further subject of the invention is an information storage medium for implementing the calibration method.

Known methods for determining the position and orientation of a vehicle include:
  providing a location system fixed to this vehicle, this location system including:
    a satellite geolocation unit;
    an inertial navigation unit containing an accelerometer and a gyrometer; and
    a magnetometer including at least two measurement axes;
  measuring, by means of the magnetometer, a first raw-measurement vector containing a raw component for each of the measurement axes, each component encoding the amplitude and the direction of the orthogonal projection of the magnetic field which passes through this magnetometer on a respective measurement axis, these measurement axes being fixed in a triaxial moving reference frame fixed to the vehicle; then
  correcting each of the raw components of the first vector by multiplying the component by a scale coefficient and by adding an offset coefficient thereto to obtain a corrected component, these scale and offset coefficients being obtained from pre-recorded data in a memory of the location system; then
  initially estimating the yaw angle of the vehicle on the basis of the corrected components of the first vector; then
  initializing, using the initial estimate of the yaw angle, a merge algorithm capable of establishing, on the basis of preceding estimates of the position and of the orientation of the vehicle and by using both the measurements from the geolocation unit and the measurements from the inertial navigation unit taken since these preceding estimates:
    new estimates of the position and of the orientation of the vehicle; and
    a margin of error in this new estimate of the orientation of the vehicle; then
  repeatedly running, for an entire phase of use, this merge algorithm to continuously update the estimate of the position and of the orientation of the vehicle.

Such methods are, for example, described in detail in the following book, in particular in chapters 5.6 and 15: Paul D. Groves: "*Principles of GNSS, Inertial, and Multisensor Integrated Navigation Systems*", Second Edition (GNSS Technology and Applications), Artech House, 2008.

Prior art is also known from EP1719975A1, WO2014/134710A1, US2011/238307A1 and EP3276302A1.

However, using a magnetometer to obtain the initial estimate of the yaw angle of the vehicle presents a few problems. The initial estimate of the raw angle must be provided on system startup and be as accurate as possible. Specifically, the poorer the initial estimate of the yaw angle, the slower the convergence of the merge algorithm toward an accurate estimate of the position and of the orientation of the vehicle.

Meanwhile, the magnetometer calibration varies with time such that values of the scale and offset coefficients which were once suitable for correctly correcting the first measurement vector are no longer suitable later on. Thus, as time elapses, the accuracy of the initial estimate of the yaw angle decreases.

Moreover, calibrating a magnetometer when it is already installed in a moving vehicle is difficult to carry out. Specifically, in this situation, the environment outside the magnetometer is not controlled and is not known.

The invention aims to provide such a method for determining the position and orientation of a vehicle in which the accuracy of the initial estimate of the yaw angle is improved.

One subject of the invention is therefore such a method.

The embodiments of this method for determining the position and orientation of a vehicle may include one or more of the features of the dependent claims.

Another subject of the invention is an information recording medium, readable by a microprocessor and including instructions for carrying out a calibration phase of the magnetometer when these instructions are executed by the microprocessor.

A further subject of the invention is a location system.

The invention will be better understood on reading the following description, provided solely by way of non-limiting example and with reference to the drawings, in which.

In these figures, the same references are used to denote the same elements.

In the remainder of this description, the features and functions that are well known to a person skilled in the art are not described in detail. In particular, for the general knowledge of a person skilled in the art regarding location systems for a vehicle using a satellite geolocation unit and an inertial navigation unit, reference is made back to the book by Groves cited above.

SECTION I: EMBODIMENT EXAMPLES

Figure 1:
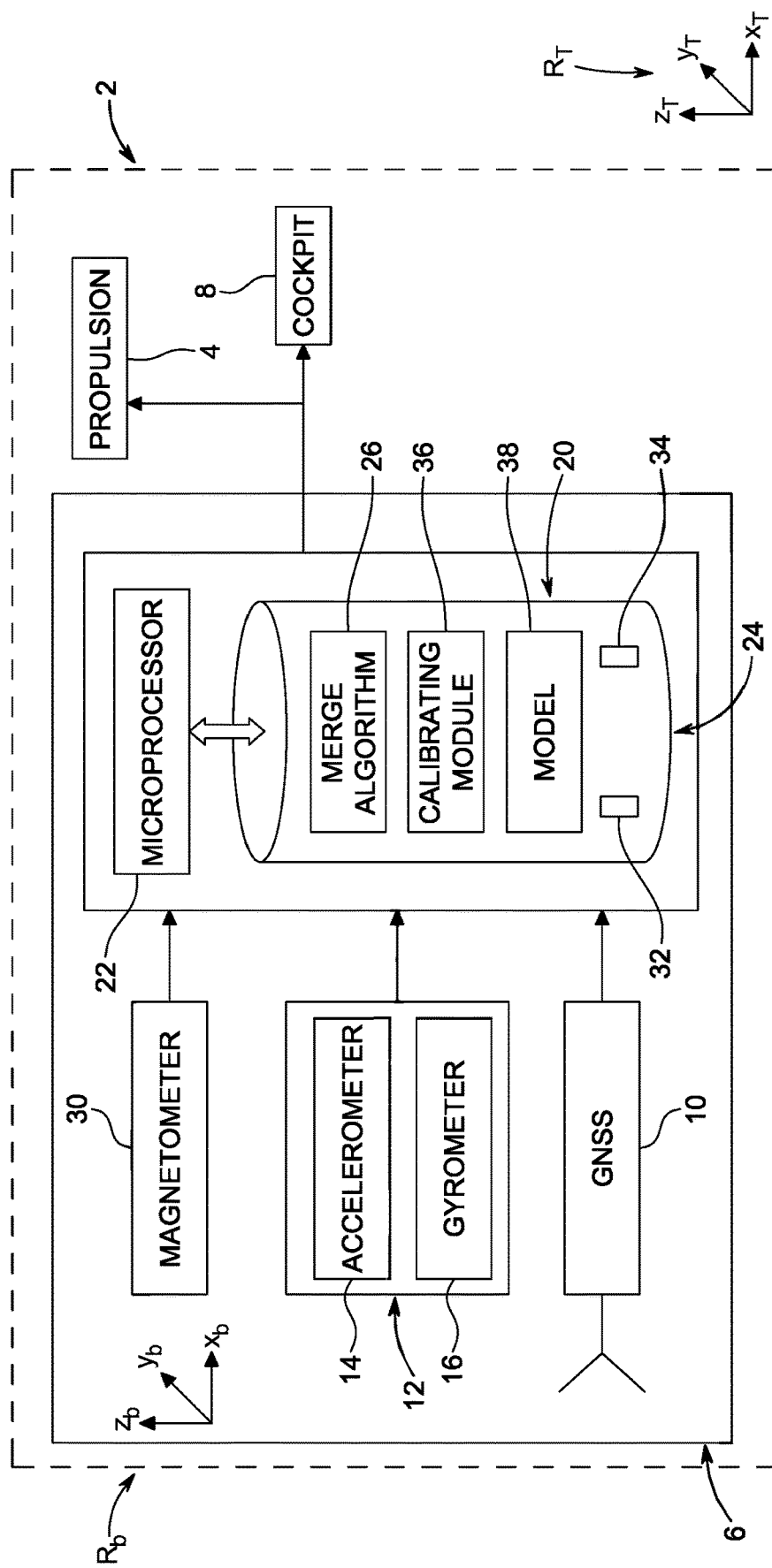
FIG. 1 is a schematic illustration of a location system for a vehicle.

FIG. 1 shows a ground, sea or air vehicle 2. The vehicle 2 may be a motor vehicle, a train, a boat, an airplane or any other like vehicle. The vehicle 2 is provided with propulsion means 4.

The vehicle 2 is also provided with a system 6 for locating this vehicle. This system 6 is capable of determining the position and orientation of the vehicle 2 in a terrestrial reference frame $R_T$. The terrestrial reference frame $R_T$ is fixed with no degree of freedom with respect to the earth. The reference frame $R_T$ includes three axes, which are typically orthogonal to one another. A moving reference frame $R_b$ is also fixed with no degree of freedom with respect to the vehicle 2. This reference frame $R_b$ includes three axes which are orthogonal to one another, denoted by $x_b$, $y_b$ and $z_b$, respectively. Conventionally, when the vehicle 2 moves horizontally, the axes $x_b$ and $y_b$ are in a horizontal plane and the axis $z_b$ is vertical.

Here, the position of the vehicle 2 in the reference frame $R_T$ is expressed by the latitude L, the longitude λ and the altitude h of the origin of the reference frame $R_b$.

The orientation of the vehicle 2 is expressed by the yaw angle $\psi$, the pitch angle $\theta$ and the roll angle $\phi$ of the reference frame $R_b$ relative to the reference frame $R_T$.

The position and orientation determined by the system 6 are generally transmitted to a cockpit 8 in order to guide, or to assist in guiding, the vehicle 2 to a predefined destination. The cockpit 8 may be a manual and/or automatic cockpit. In the case of a manual cockpit, the determined position and orientation are transmitted to a human-machine interface to assist a human being in driving the propulsion means 4. In the case of an automatic cockpit, the determined position and orientation are automatically converted into commands for driving the propulsion means 4, then transmitted automatically to these propulsion means 4.

The system 6 includes a satellite geolocation unit 10 and an inertial navigation unit 12. The unit 10 is known by the acronym GNSS (global navigation satellite system). The unit 10 is in this case a single-antenna geolocation unit and not a multi-antenna geolocation unit. The unit 10 is therefore incapable of measuring the absolute orientation of the vehicle 2 in the reference frame $R_T$ on the basis of the signals transmitted by the satellites.

The unit 12 is known by the acronym INS (inertial navigation system). The unit 12 includes in particular a triaxial accelerometer 14 and a triaxial gyrometer 16. By virtue of these sensors, the unit 12 is capable of measuring the variation of the orientation of the vehicle 2. However, the unit 12 is itself also incapable of directly measuring the orientation of the vehicle 2 in the reference frame $R_T$.

To determine the position and orientation of the vehicle 2 on the basis of the measurements from the units 10 and 12, the system 6 includes a programmable electronic computer 20. This computer 20 is capable of acquiring the measurements from the units 10 and 12 and, on the basis of these measurements, of determining the position and orientation of the vehicle 2 in the reference frame $R_T$. The computer 20 includes a microprocessor 22 and a memory 24 including the instructions and data required to implement the methods described with reference to FIGS. 2 and 3.

More specifically, the memory 24 includes the instructions for a module 26. The module 26 runs in particular a merge algorithm capable of establishing, on the basis of a preceding estimate of the position and of the orientation of the vehicle 2 and new measurements from the units 10 and 12 acquired since this preceding estimate, a new estimate of the position and of the orientation of the vehicle 2. The merge algorithm also establishes, for each new estimate of the position and of the orientation of the vehicle 2, a margin of error in this estimate.

Merge algorithms are well known to those skilled in the art. For example, the interested reader may again reference back to the book by Groves cited above. The merge algorithm merges the measurements from the units 10 and 12 to obtain estimates of the position and of the orientation of the vehicle 2 which are more accurate than if, for example, only the measurements from the unit 10 were used to determine the position and only the measurements from the unit 12 were used to determine the orientation of the vehicle 2. In other words, to establish each of the estimates of the position and of the orientation of the vehicle 2, the module 26 uses the measurements both from the unit 10 and from the unit 12. For example, this merge algorithm is implemented in the form of a Kalman filter.

As mentioned in the introduction of the present application, it is necessary to initialize the merge algorithm with initial estimates of the position and of the orientation of the vehicle 2. These initial estimates are produced, for example, as described in the book by Groves. Here, the initial estimate of the yaw angle is obtained from the measurements from a magnetometer. To this end, the system 6 therefore additionally includes a magnetometer 30 connected to the computer 20.

The magnetometer 30 is a triaxial magnetometer, i.e. it includes three non-collinear measurement axes, fixed in the reference frame $R_b$. Here, these three measurement axes are parallel to the three axes $x_b$, $y_b$ and $z_b$ of the reference frame $R_b$, respectively. Each measurement of the magnetic field taken by this magnetometer 30 comprises three components, each encoding the amplitude and the direction of the orthogonal projection, on a respective measurement axis, of the magnetic field which is passing through the magnetometer 30 when the measurement is taken. The group formed by the three components measured by the magnetometer 30 is referred to hereinafter as the "raw-measurement vector" and denoted by $B_{raw}$.

From the moment of its manufacture or placement within the vehicle 2, the measurements from the magnetometer 30 may suffer interference. Thus, even when used for the first time, it may be that the measurements from the magnetometer 30 are quite inaccurate. To improve the accuracy of the measurements provided by the magnetometer 30, in particular when it is used for the first time, the memory 24 includes default values 32 for scale and offset coefficients used to correct the raw components of the vector $B_{raw}$. Here, for example, these default values are never updated over the period of use of the magnetometer 30.

The memory 24 also includes pre-recorded data used to correct the raw components of the vector $B_{raw}$. Here, these pre-recorded data are current values 34 for the scale and offset coefficients. Unlike the default values 32, the current values 34 are regularly updated over the period of use of the magnetometer 30 so as to adjust them continuously to the context in which the magnetometer 30 is being used. Thus, over the period of use of the magnetometer 30, the vector $B_{raw}$ is preferably corrected using the current values 34 rather than using the default values 32. The vector obtained after correction of the raw components of the vector $B_{raw}$ is referred to as the "corrected measurement vector" and denoted by $B_C$. The components of the vector $B_C$ are referred to as "corrected components".

To update the current values 34, the memory 24 also includes the instructions for a module 36 for calibrating the magnetometer 30.

The memory 24 also includes a pre-recorded model 38 of the geomagnetic field. The model 38 associates, with each position liable to be occupied by the vehicle 2, the three components of the geomagnetic field present at this position. The group formed by the three components of the geomagnetic field is referred to hereinafter as the "reference vector" and denoted by $B_O$. Each of the components of the vector $B_O$ encodes the amplitude and direction of the orthogonal projection, on a respective axis of the reference frame $R_T$, of the geomagnetic field. For example, the model 38 is the model known by the acronym IGRF (International Geomagnetic Reference Field).

The use of the system 6 is broken down into successive periods of activity separated from one another by periods of inactivity. During these periods of inactivity, the system 6 is not active, i.e. it is not determining the position and orientation of the vehicle 2. Typically, during the periods of inactivity, the units 10 and 12 and the magnetometer 30 do not take any measurements and do not transmit any measurements to the computer 20. The computer 20 therefore does not perform any processing on these measurements.

These periods of inactivity generally last several minutes, several hours or several days. However, during these periods of inactivity, the current values 34 of the scale and offset coefficients estimated in a preceding period of activity are retained in the memory 24. To this end, the memory 24 is a non-volatile memory.

For example, during the periods of inactivity, the system 6 is switched off or on standby.

Conversely, during each period of activity, the units 10 and 12 and the magnetometer 30 deliver new measurements to the computer 20, which processes them to determine the position and orientation of the vehicle 2 according to these new measurements. These periods of activity come one after the other in succession and are each separated from one another by a period of inactivity of variable length.

Figure 2:
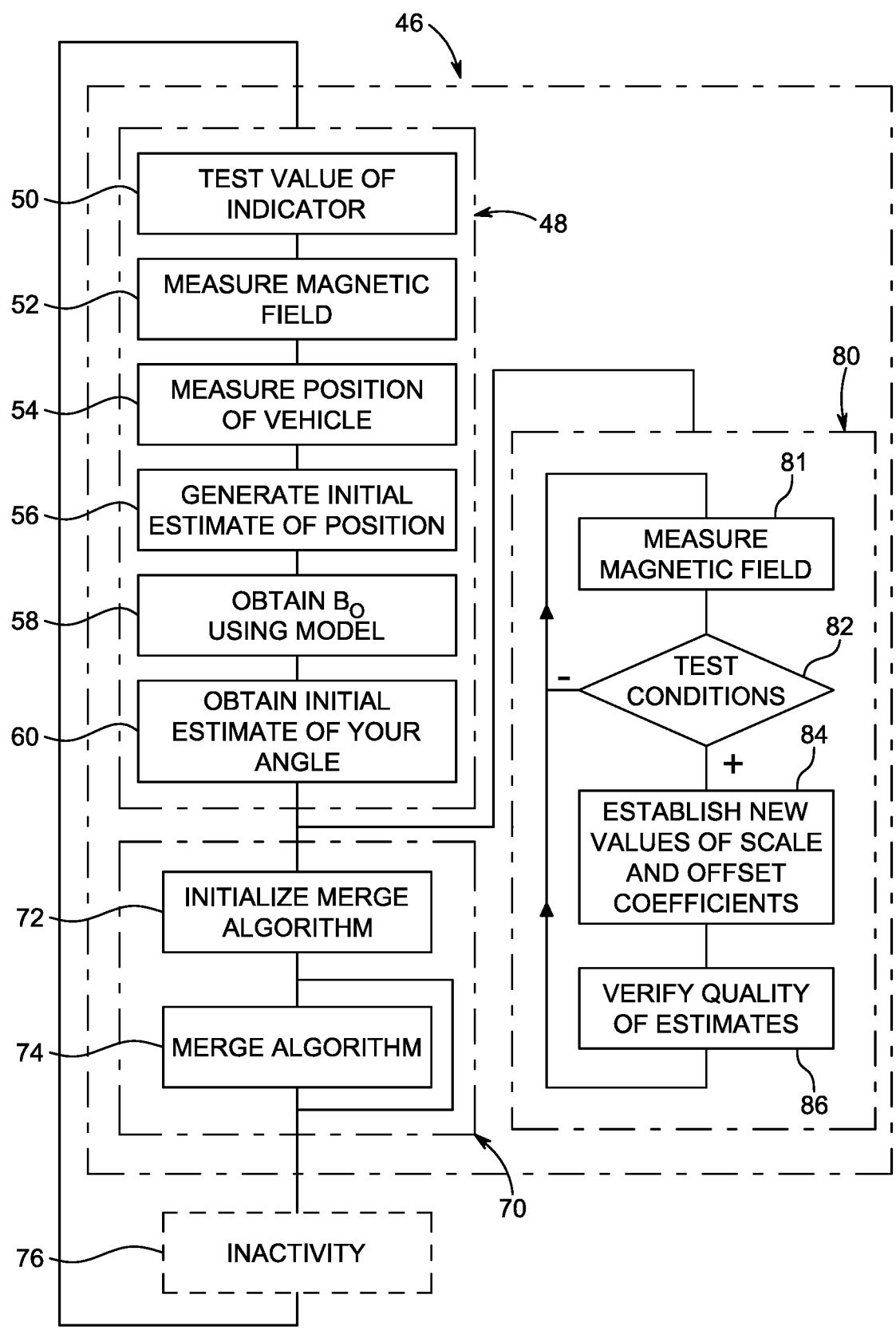
FIG. 2 is a flowchart of a method for determining the position and orientation of a vehicle using the system of FIG. 1.

FIG. 2 shows a period of activity 46.

The period 46 begins with a phase 48 of initializing the system 6. This phase 48 begins immediately after the activation of the system 6, i.e. typically just after it has been powered up. At the beginning of phase 48, in an operation 50, the computer 20 tests whether the value of an indicator $I_{CF}$ is higher than or equal to one. The value of this indicator $I_{CF}$ is recorded in the memory 24. If the value of the indicator $I_{CF}$ is lower than one, in the subsequent operations, the default values 32 of the scale and offset coefficients are used to correct the vector $B_{raw}$. Conversely, if the value of the indicator $I_{CF}$ is higher than or equal to one, in the subsequent operations, it is the current values 34 which are used to correct the vector $B_{raw}$.

During the first period of activity of the system 6, the value of the indicator $I_{CF}$ is zero.

Next, the computer 20 produces an initial estimate of the orientation of the vehicle 2 and, potentially, an estimate of other parameters. As an example of other parameters, the computer 20 may estimate scale and offset coefficients for other sensors of the system 6 like for the sensors 14 and 16. Hereinafter, only one example of an embodiment for estimating the initial orientation of the vehicle 2 is described.

In an operation 52, the magnetometer 30 measures the magnetic field passing through same and delivers a first vector $B_{raw}$ to the computer 20.

Next, in an operation 54, the computer 20 corrects the vector $B_{raw}$ to obtain a corrected first vector $B_C$. In this operation, each component of the vector $B_C$ is obtained by multiplying the component of the vector $B_{raw}$ measured for the same measurement axis by the scale coefficient associated with this measurement axis and by adding the offset coefficient associated with the same measurement axis thereto. An example of a formula for obtaining the vector $B_C$ from the vector $B_{raw}$ is given hereinbelow by relationship 3). The vector $B_C$, like the vector $B_{raw}$, is expressed in the reference frame $R_b$.

The values of the scale and offset coefficients used in this operation 54 are either the default values 32 or the current values 34 depending on the result of the test performed in operation 50.

In an operation 56, the unit 10 measures the position of the vehicle 2 in the reference frame $R_T$. In operation 56, to do this, the unit 10 delivers an initial estimate of the position of the vehicle 2 in the reference frame $R_T$, for example, without using the measurements from the unit 12 and from the magnetometer 30.

Next, in an operation 58, the vector $B_0$ corresponding to the initial position measured in operation 56 is obtained by using the model 38. It should be noted that, in operation 56, it is not necessary to use the merge algorithm. Specifically, given that the geomagnetic field varies quite slowly at the surface of the earth, at this stage, approximate knowledge of the position of the vehicle 2 with, for example, a margin of error smaller than 50 km, 100 km or 1000 km, is sufficient to obtain an accurate estimate of the vector $B_0$. Typically, the accuracy in the estimate of the initial position by the unit 10 is substantially below 50 km. For example, the accuracy is generally below 50 m or 10 m.

In an operation 60, the initial estimate of the yaw angle is produced using the vector $B_C$ obtained on completion of operation 54. Specifically, the vectors $B_C$ and $B_0$ correspond to the same magnetic field but expressed in the reference frames $R_b$ et $R_T$, respectively. It is therefore possible to determine the yaw angle of the vehicle 2, and hence of the reference frame $R_b$ relative to the reference frame $R_T$, from the angle formed by the vector $B_C$ with the axes of the reference frame $R_b$.

Once the initialization phase 48 has ended, a phase 70 of using the system 6 begins. In phase 70, the module 26 repeatedly estimates the position and orientation of the vehicle 2 by reiterating, for example at regular intervals, the running of the merge algorithm. This phase 70 then lasts until the end of the period 46 of activity and hence until the beginning of a next period 76 of inactivity.

At the beginning of phase 70, in an operation 72, the merge algorithm is initialized. The initialization of the merge algorithm consists in particular in loading initial values for the position and orientation of the vehicle 2. These initial values are used as a starting point for this merge algorithm in order subsequently to establish, with greater accuracy, this position and this orientation of the vehicle 2. These initial values loaded in operation 72 are those obtained on completion of initialization phase 48. In particular, the yaw angle is initialized using the value obtained on completion of operation 60.

Next, in an operation 74, the merge algorithm is run repeatedly by the module 26. More specifically, each time new measurements from the unit 10 and/or from the unit 12 are acquired by the computer 20, the merge algorithm is run in order to update the estimate of the position and of the orientation of the vehicle 2.

More specifically, each time the merge algorithm is run, the module 26 establishes:

new estimates of the position and of the orientation of the vehicle 2; and margins of error in these new estimates of the position and of the orientation.

These new estimates of the position and of the orientation of the vehicle 2 and the corresponding margins of error are established on the basis of the preceding estimates of the position and of the orientation of the vehicle 2, of the preceding established margins of error and of the new measurements from the units 10 and 12. In this embodiment, in operation 74, the measurements from the magnetometer 30 are not used.

The margin of error or the accuracy in the new estimate of the orientation is here given by the values of three standard deviations denoted by $\sigma_\psi$, $\sigma_\theta$ and $\sigma_\varphi$, respectively. The standard deviations $\sigma_\psi$, $\sigma_\theta$ and $\sigma_\varphi$ correspond to the standard deviations in the estimates of the yaw angle $\psi$, of the pitch angle $\theta$ and of the roll angle $\varphi$, respectively.

Conventionally, the beginning of the use phase is often called the "alignment phase". Typically, the alignment phase starts with the beginning of the merge algorithm run and ends once the accuracies in the estimates of the yaw $\psi$, pitch $\theta$ and roll $\varphi$ angles are sufficient.

The repetitions of operation 74 end only when the current period 46 of activity comes to an end and the new period 76 of inactivity begins. For example, the repetition of operations 74 comes to an end when the system 6 is switched off.

It is known that the most difficult part of phase 50 is that of obtaining an accurate estimate of the yaw angle of the vehicle 2. Specifically, algorithms already exist which allow an initial estimate of the roll and pitch angles, and of the other desired parameters, to be obtained quickly. Conventionally, the initial estimate of the roll and pitch angles is, for example, obtained from the accelerometer 14 measurements. In the system 6, to obtain a reliable initial estimate of the yaw angle, the following operations are performed:

Parallel to phase 70, the module 36 carries out a phase 80 of calibrating the magnetometer 30. Phase 80 can begin as soon as the vector $B_0$ has been obtained and the module 26 has established an estimate of the orientation of the vehicle 2. The purpose of phase 80 is to improve the calibration of the magnetometer 30, i.e. to improve the current values 34 of the scale and offset coefficients so that, the next time operation 54 is performed, the vector $B_C$ obtained is more accurate than if the default values 32 were used. Specifically, even after its manufacture and installation within the system 6, the magnetometer 30 is often exposed to numerous outside events which temporarily or permanently modify its operation. Thus, with time, the default values 32 become less useful and it is possible to determine new current values which allow better correction of the vector $B_{raw}$ and hence a more correct vector $B_C$ to be obtained.

Here, the phase 80 begins with a step 81 of measuring the magnetic field by means of the magnetometer 30 and acquiring the vector $B_{raw}$ by means of the computer 20. Next, in the following steps, the vector $B_{raw}$ mentioned corresponds to the vector $B_{raw}$ measured and acquired in this step 81. In this step 81, the module 36 also acquires the estimate of the orientation of the vehicle 2 and the margin of error in this estimate that was established in the most recent iteration of operation 74.

Phase 80 is followed by a step 82 in which various conditions are tested in order to ensure that the system 6 is indeed in a situation in which updating the current values 34 of the scale and offset coefficients will allow new current values to be obtained which, if they were immediately used in an operation 54, would allow a more accurate initial estimate of the yaw angle to be obtained:

than if the default values 32 were used; and
than if the current values 34 had not been updated.

In this embodiment, to this end, four tests, called test 1), test 2), test 3) and test 4), respectively, are performed in step 82.

Test 1) consists in verifying that the accuracy in the current estimate of the orientation of the vehicle 2 is sufficiently high. Specifically, the values of the yaw, pitch and roll angles estimated by the merge algorithm are used when updating the scale and offset coefficients. Consequently, if the accuracy in the estimates of these angles is not high enough, it may have a negative effect on the calibration of the magnetometer 30, instead of improving it. Now, it may take the merge algorithm a certain amount of time before it provides a reliable estimate of the orientation of the vehicle 2. Thus, it is important to wait for the orientation of the vehicle 2 to be estimated with sufficiently high accuracy before determining new current values 34 for the scale and offset coefficients.

Here, test 1) is the following: $\sigma_\psi < S_1$ and $\sigma_\theta < S_1$ and $\sigma_\varphi < S_1$, where:

$\sigma_\psi$, $\sigma_\theta$ and $\sigma_\varphi$ are margins of error and, more specifically, the standard deviations most recently established by the merge algorithm for the estimates of the yaw, pitch and roll angles, respectively; and $S_1$ is a predetermined threshold.

Typically, the threshold value $S_1$ is lower than 10° or 5°. Here, the threshold $S_1$ is chosen to be equal to 5. If test 1) is passed, it means that the accuracies in the estimates of the yaw, pitch and roll angles are high enough.

Test 2) consists in determining whether there is a source of magnetic interference temporarily located in proximity to the magnetometer 30. Such a source of interference is referred to as a "temporary magnetic disruptor" hereinafter. A magnetic disruptor modifies the magnetic field measured by the magnetometer 30 such that it does not correspond exactly to the geomagnetic field. For example, a magnetic disruptor may be a metal part or a permanent magnet. A temporary magnetic disruptor is, for example, a magnetic disruptor which moves in the reference frame $R_b$. If the scale and offset coefficients are updated in the presence of a temporary magnetic disruptor, the updated values of these coefficients allow the measurement errors caused by this disruptor to be largely eliminated. However, if this disruptor subsequently disappears during the period of inactivity, then, on startup in the next period of activity, the initial estimate of the yaw angle will be poor. This will slow the convergence of the merge algorithm towards an accurate estimate of the position and of the orientation of the vehicle 2 considerably. Here, to overcome this problem, the updating of the current values 34 of the scale and orientation coefficients is put on hold if the presence of a temporary magnetic disruptor in proximity to the magnetometer 30 is detected.

Here, test 2) is the following: $|\|B_{raw}\| - \|B_0\|| < S_2$, where:

$\|B_{raw}\|$ is the norm of the currently measured vector $B_{raw}$;
$\|B_0\|$, is the norm of the reference vector, for example obtained on completion of operation 58;
$S_2$ is a predetermined threshold;
$|\|B_{raw}\| - \|B_0\||$ is the absolute value of the difference between the norms $\|B_{raw}\|$ and $\|B_0\|$.

Typically, the threshold $S_2$ is lower than 40 μT or 20 μT. Here, the threshold $S_2$ is equal to 20 μT. If test 2) is not passed, it is determined that there is a disruptor in proximity to the magnetometer 30.

Test 2) has the advantage of being independent of the accuracy in the estimate of the orientation of the vehicle 2. However, the difference between the norms is also dependent on internal imperfections in the magnetometer 30, such that the value of the threshold $S_2$ cannot be chosen so that it is too low. Test 2) is also insensitive to magnetic interference which modifies only the direction of the magnetic field measured by the magnetometer 30 without modifying the norm thereof.

Test 3) is another test which makes it possible to determine whether there is a source of magnetic interference temporarily located in proximity to the magnetometer 30. This test 3) is more sensitive to the presence of a disruptor. For this, it compares the difference between the components of the vector $B_{raw}$ and estimates of these components. The estimates of the components of the vector $B_{raw}$ are obtained from the components of the vector $B_0$ and from the current estimate of the orientation of the vehicle 2.

Here, test 3) is the following: $|Y_{k,x}/\sigma_{Y,x}| < S_3$ and $|Y_{k,y}/\sigma_{Y,y}| < S_3$ and $|Y_{k,z}/\sigma_{Y,z}| < S_3$ where:

$Y_{k,x}$, $Y_{k,y}$, $Y_{k,z}$ are the differences between the components of the vector $B_{raw}$ and the estimates of these components;

$\sigma_{Y,x}$, $\sigma_{Y,y}$ and $\sigma_{Y,z}$ are standard deviations caused by the uncertainties in the estimate of the scale and offset coefficients and the measurement errors;

/ is the symbol for the division operation;

|...| is the symbol that denotes the absolute-value operation; and $S_3$ is a predetermined threshold.

An example of calculating the differences $Y_{k,x}$, $Y_{k,y}$, $Y_{k,z}$ and the standard deviations $\sigma_{Y,x}$, $\sigma_{Y,y}$ and $\sigma_{Y,z}$ is described in detail with reference to FIG. 3. In general, the threshold $S_3$ is lower than 4 or 3. Here, the threshold $S_3$ is equal to 3. If test 3) is not passed, it is determined that there is a disruptor in proximity to the magnetometer 30.

Test 4) consists in verifying that at least the yaw angle of the vehicle 2 has been changed enough since the last update of the current values 34. Specifically, when the vehicle 2 is in a situation in which the yaw angle remains constant for quite a long interval, it is pointless, or even risky, to attempt to update the current values 34 of the scale and offset coefficients multiple times during this interval. More specifically, during this interval, it is not possible to know whether an error in the measurement from the magnetometer 30 has to be corrected by modifying the value of a scale coefficient or the value of an offset coefficient. Thus, in this particular situation, transitory interference in the measurement from the magnetometer 30 may lead to the calibration of the magnetometer 30 being made worse, rather than improved. Moreover, in any case, updating the current values 34 in this situation is pointless. Test 4) therefore allows this risk of negatively affecting the calibration to be eliminated and pointless updating of the current values 34 in such situations to be avoided.

Here, test 4) is the following: $\|Angle-LastAngle\| < S_4$, where:

"Angle" is a vector including the values of the three angles $\psi$, $\theta$ and $\varphi$ that were most recently determined for the yaw, pitch and roll angles, respectively, of the vehicle 2;

"LastAngle" is a vector including the values of the three angles $\psi$, $\theta$ and $\varphi$ that were determined during the last update of the current values 34;

$\|...\|$ is the norm of the difference between the vectors "Angle" and "LastAngle"; and $S_4$ is a predetermined threshold.

The threshold value $S_4$ is typically lower than 5° or 2°. Here, the threshold value $S_4$ is lower than 1°. The threshold value $S_4$ is also preferably higher than 0.5° or 1°. If test 4) is passed, it is determined that the yaw angle has not been changed enough since the last update of the current values 34.

If all of the tests performed in operation 82 confirm that the situation is favorable for updating the current values 34 of the scale and offset coefficients, then the process moves on to a step 84 of establishing new current values 34 for the scale and offset coefficients.

In step 84, the new current values 34 are updated by the module 36 so as to decrease the difference between the components of the vectors $B_C$ and $B_0$ when these components are expressed in a common reference frame. To this end, the vector $B_0$ is, for example, that obtained in operation 58. Here, the common reference frame is the reference frame $R_b$. More specifically, to this end, the module 36 runs an estimation algorithm which establishes a new estimate of the values of the scale and offset coefficients on the basis of:

the new measurement of the geomagnetic field by the magnetometer 30;

the reference vector $B_0$;

the preceding estimate of the current values established for the scale and offset coefficients; and the current estimate of the orientation of the vehicle 2.

An embodiment of this estimation algorithm is described in greater detail with reference to method of FIG. 3.

Once these new estimates of the current values 34 have been established, they are recorded in the memory 24 and replace the preceding current values 34.

In this embodiment, on completion of step 84, in a step 86, the quality of the new estimates of the current values 34 is verified. To this end, in this step 86, the module 36 implements two tests referred to hereinafter as test 5) and test 6), respectively.

Test 5) consists in ensuring that the new estimates of the values of the scale and offset coefficients are within plausible predetermined ranges of values. Here, test 5) is implemented only for the new estimates of the scale coefficients. For example, test 5) consists here in verifying that the following three conditions are met:

$S_{5min} < 1/a_x < S_{5max}$,  condition 5.1

$S_{5min} < 1/a_y < S_{5max}$,  condition 5.2

$S_{5min} < 1/a_z < S_{5max}$,  condition 5.3 where:

$1/a_x$, $1/a_y$ and $1/a_z$ are new estimates of the scale coefficients for the measurement axes $x_b$, $y_b$ and $z_b$, respectively, of the magnetometer 30;

$S_{5min}$ and $S_{5max}$ are predetermined thresholds.

The calculation of the values of the coefficients $a_x$, $a_y$ and $a_z$ is described in detail with reference to the method of FIG. 3.

In this embodiment, the threshold value $S_{5min}$ is generally lower than $1/s$, where s is a number greater than or equal to 1.5, 2 or 3. Regarding the threshold value $S_{5max}$, it is generally higher than or equal to s. Here, the thresholds $S_{5min}$ and $S_{5max}$ are equal to 0.5 and 2, respectively.

In this embodiment, when condition 5.1 is not met by the coefficient $1/a_x$, then its value is bounded, i.e. modified so as to remain within the range $[S_{5min}; S_{5max}]$. For this, if the coefficient $1/ax$ is lower than $S_{5min}$, the value of the coefficient $a_x$ is automatically modified such that $1/a_x$ is equal to $S_{5min}$. Conversely, if the coefficient $1/a_x$ is higher than $S_{5max}$, the value of the coefficient $a_x$ is automatically modified such that $1/a_x$ is equal to $S_{5max}$. The same bounding mechanism is implemented for the coefficients $1/a_y$ and $1/a_z$.

Test 6) consists in verifying that the margin of error in the estimate of one or more of the scale and offset coefficients is small enough for it to be usable in correcting the measurements from the magnetometer 30.

Here, test 6) consists in verifying that the following six conditions are met:

$P_k(1,1) < S_{6s}$,  condition 6.1

$P_k(2,2) < S_{6s}$,  condition 6.2

$P_k(4,4) < S_{6o}$,  condition 6.3

$P_k(5,5) < S_{6o}$,  condition 6.4

$P_k(3,3) < S_{6s}$,  condition 6.5

$P_k(6,6) < S_{6s}$,  condition 6.6 where:

the coefficients $P_k(1,1)$, $P_k(2,2)$ and $P_k(3,3)$ are diagonal coefficients of a covariance matrix $P_k$ which are functions of the margins of error in the estimates of the scale coefficients for the axes $x_b$, $y_b$ and $z_b$, respectively;

the coefficients $P_k(4,4)$, $P_k(5,5)$ and $P_k(6,6)$ diagonal coefficients of the covariance matrix $P_k$ which are functions of the margins of error in the new estimates of the offset coefficients for the axes $x_b$, $y_b$ and $z_b$, respectively; and $S_{6s}$ and $S_{6o}$ are predetermined thresholds.

The threshold value $S_{6s}$ is typically lower than or equal to 1, 0.5 or 0.33. Here, the threshold value $S_{6s}$ is equal to 0.33. The threshold value $S_{6o}$ is generally lower than 10 μT, 5 μT or 3 μT. For example, here, the thresholds $S_{6s}$ and $S_{6o}$ are equal to 0.33 and 3 μT.

In the case of a vehicle moving essentially horizontally, the variations in the measurement along the axis $z_b$ are small. Consequently, the margin of error in the scale and offset coefficients for correcting the raw component of the magnetometer along this axis $z_b$ may decrease much more slowly than the margin of error in the scale and offset coefficients that are associated with horizontal measurement axes. Moreover, for this type of vehicle, the measurement of the magnetic field along the axis $z_b$ is not very important and has little effect on the initial estimate of the yaw angle. Consequently, substantial inaccuracy in the scale and offset coefficients associated with the axis $z_b$ is not necessarily an issue. The rest of the description is given within this particular case. Consequently, in this embodiment, if one of conditions 6.1, 6.2, 6.4 or 6.5 is not met, then the value of the indicator $I_{CF}$ is taken as equal to zero. Thus, if this indicator $I_{CF}$ remains equal to zero until the end of the current period of activity; in the next period of activity, the yaw angle will be initialized by using the default values 32.

If the four conditions 6.1, 6.2, 6.4 and 6.5 are met and at least one of conditions 6.3 and 6.6 is not met, then the value of the indicator $I_{CF}$ is taken as equal to one.

If the six conditions 6.1 to 6.6 are met, then the value of the indicator $I_{CF}$ is taken as equal to two.

On completion of step 86, the method returns to step 81. Thus, the calibration of the magnetometer 30 is performed continuously until the end of the current period of activity. If the indicator $I_{CF}$ is greater than or equal to zero until the end of the current period of activity, at the start of the next period of activity, the initial estimate of the yaw angle will be obtained by using the last current values 34 recorded in the memory 24 in the preceding period of activity. The method described here therefore makes it possible to obtain, in most cases, current values 34 which allow better correction of the vector $B_{raw}$ and hence a more accurate initial estimate of the yaw angle. This therefore allows the convergence of the merge algorithm towards an accurate estimate of the position and of the orientation of the vehicle 2 to be speed up considerably.

Figure 3:
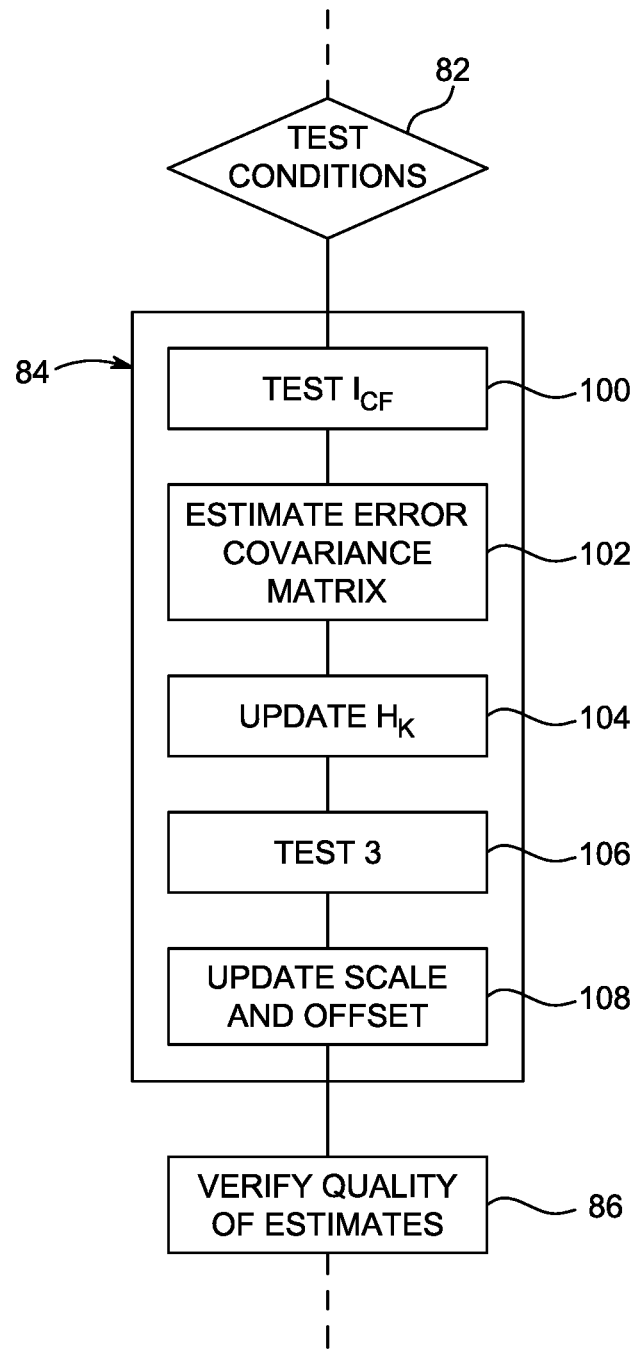
FIG. 3 is a flowchart of a method for estimating scale and offset coefficients for the calibration of a magnetometer implemented in the method of FIG. 2.

FIG. 3 is a more detailed representation of a method for establishing a new estimate of the current values of the scale and offset coefficients. This method is implemented in step 84. Here, this method is described in the particular case in which the estimation algorithm used is a linear Kalman filter. Hereinafter, the terminology and notations used correspond to those used conventionally for Kalman filters.

The following notations and relationships used in this Kalman filter are now defined.

$B_0^n$ is the reference vector obtained in the execution of operation 58 and the components of which are expressed in the reference frame $R_T$.

$B_0^b$ is the reference vector the components of which are expressed in the reference frame $R_b$.

$C_n^b$ is a rotation matrix which allows the components of a vector that are expressed in the reference frame $R_T$ to be converted into components of the same vector but expressed in the reference frame $R_b$. This matrix $C_n^b$ is a square matrix with three rows and three columns. The coefficients of the matrix $C_n^b$ are established on the basis of the estimates of the angles ψ, θ and φ provided by the merge algorithm. There is then the following equation:

$$B_0^b = C_n^b \cdot B_0^n. \qquad \text{Relationship 1)}$$

In this relationship 1), as in the following relationships, the symbol "." denotes the multiplication operation.

The vector $B_{raw}$ is modeled by the following relationship:

$$B_{raw} = A \cdot B_0^b + \textit{Off} + \eta, \qquad \text{Relationship 2)}$$

where:
Off is a vector with three components $\textit{Off}_x$, $\textit{Off}_y$, $\textit{Off}_z$, the components $\textit{Off}_x$, $\textit{Off}_y$, $\textit{Off}_z$ being associated with the axes $x_b$, $y_b$ and $z_b$, respectively;
A is a square diagonal matrix with three rows and three columns, the three coefficients of the diagonal of which are $a_x$, $a_y$ and $a_z$, the coefficients $a_x$, $a_y$ and $a_z$ being associated with the axes $x_b$, $y_b$ and $z_b$, respectively; and
η denotes the noise in the measurement from the magnetometer 30.

The vector $B_C$ is obtained using the following relationship:

$$B_C = S \cdot (B_{raw} - \textit{Off}), \qquad \text{Relationship 3)}$$

where S is the inverse of the matrix A defined in relationship 2).

It is therefore this relationship 3) which is used in operation 54 to correct the vector $B_{raw}$. The scale coefficients associated with the axes $x_b$, $y_b$ and $z_b$ are therefore equal to $1/a_x$, $1/a_y$ and $1/a_z$, respectively. The offset coefficients associated with the axes $x_b$, $y_b$ and $z_b$ are equal to $-\textit{Off}_x/a_x$, $-\textit{Off}_y/a_y$ and $-\textit{Off}_z/a_z$, respectively.

The state vector $X_k$ is defined by the following relationship:

$$X_k = [a_x, a_y, a_z, \textit{Off}_x, \textit{Off}_y, \textit{Off}_z]^T, \qquad \text{Relationship 4)}$$

where:
the components $a_x$, $a_y$, $a_z$, $\textit{Off}_x$, $\textit{Off}_y$, $\textit{Off}_z$ are the same coefficients as those defined in relationship 2);
the symbol "$T$" denotes the transposed operation;
the index k is a serial number.

The state prediction or propagation equation for the Kalman filter is defined by the following relationship:

$$X_{k+1|k} = X_{k|k} + \nu, \qquad \text{Relationship 5)}$$

where:
$X_{k|k}$ is the estimate of the state vector at time k, which estimate is obtained by taking all of the measurements up to time k into account;
$X_{k+1|k}$ is the estimate of the state vector at time k+1, which estimate is obtained by taking only the measurements up to time k into account;
ν is the noise in the process.

Relationship 5) is explained by the fact that the scale and offset coefficients are assumed, in a first approximation, to be constant with time.

The prediction or propagation equation for the error covariance matrix is defined by the following relationship:

$$P_{k+1|k} = P_{k|k} + Q_k, \qquad \text{Relationship 6)}$$

where:
$P_{k|k}$ is the estimate of the error covariance matrix at time k obtained by taking all of the measurements up to time k into account;
$P_{k+1|k}$ is the estimate of the covariance matrix at time k+1 obtained by taking only the measurements up to time k into account;
$Q_k$ is the covariance matrix for the process noise ν.

The matrix $Q_k$ is defined by the following relationship:

$$Q_k = \begin{bmatrix} \sigma_{scale}^2 & & & & & \\ & \sigma_{scale}^2 & & & & \\ & & \sigma_{scale}^2 & & & \\ & & & \sigma_{Off}^2 & & \\ & & & & \sigma_{Off}^2 & \\ & & & & & \sigma_{Off}^2 \end{bmatrix} \quad \text{Relationship 7)}$$

where:
- $\sigma_{scale}^2$ is the variance in the process noise ν in the estimate of each scale coefficient; and
- $\sigma_{Off}^2$ is the variance in the process noise ν in the estimate of each offset coefficient.

By way of illustration, typical values of the coefficients $\sigma_{scale}^2$ and $\sigma_{Off}^2$ are $10^{-8}$ and $10^{-6}$, respectively.

Using the notations introduced above, the model of the vector $B_{raw}$ is defined by the following relationship:

$$B_{raw} = H_k \cdot X_k + \eta, \quad \text{Relationship 8)}$$

where:
- η is the noise in the measurement; and
- $H_k$ is the matrix defined by the following relationship:

$$H_k = \begin{bmatrix} B_{0,x}^b & 0 & 0 & 1 & 0 & 0 \\ 0 & B_{0,y}^b & 0 & 0 & 1 & 0 \\ 0 & 0 & B_{0,z}^b & 0 & 0 & 1 \end{bmatrix} \quad \text{Relationship 9)}$$

where $B_{0,x}^b$, $B_{0,y}^b$, $B_{0,z}^b$ are the three components of the vector $B_0^b$ which are expressed in the reference frame $R_b$ and obtained using relationship 1). It should be noted that the components $B_{0,x}^b$, $B_{0,y}^b$, $B_{0,z}^b$ are functions of the estimates of the yaw, pitch and roll angles established by the merge algorithm. Thus, the matrix $H_k$ is updated on each new estimate of these yaw, pitch and roll angles that is established by the merge algorithm.

The innovation $Y_k$, i.e. the difference between the vector $B_{raw}$ and the estimate of this vector obtained using the vector $B_o$, is given by the following relationship:

$$Y_k = B_{raw} - H_k \cdot X_{k|k-1}. \quad \text{Relationship 10)}$$

The covariance $S_k$ of the innovation is given by the following relationship:

$$S_k = H_k P_{k|k-1} \cdot H_k^T + R_k, \quad \text{Relationship 11)}$$

where $R_k$ is the covariance matrix for the measurement noise.

The matrix $S_k$ is a diagonal matrix with three rows and three columns. The coefficients of its diagonal are denoted by $\sigma_{Y,x}^2$, $\sigma_{Y,y}^2$ and $\sigma_{Y,z}^2$ and correspond to the square of the coefficients used in test 3).

The matrix $R_k$ is defined by the following relationship:

$$R_k = \begin{bmatrix} \sigma_{MagNoise}^2 & 0 & 0 \\ 0 & \sigma_{MagNoise}^2 & 0 \\ 0 & 0 & \sigma_{MagNoise}^2 \end{bmatrix} \quad \text{Relationship 12)}$$

where $\sigma_{MagNoise}^2$ is the variance in the noise in the measurement from the magnetometer 30 and interference in the measured magnetic field. Typically, the value of the coefficient $\sigma_{MagNoise}^2$ is chosen to be between 1 μT and 10 μT. For example, here, this coefficient is equal to 10 μT.

The Kalman gain is defined by the following relationship:

$$K_k = P_{k|k-1} \cdot H_k^T \cdot S_k^{-1}. \quad \text{Relationship 13)}$$

The estimate update equation for the state vector $X_k$ is defined by the following relationship:

$$X_{k|k} = X_{k|k-1} + K_k \cdot Y_k. \quad \text{Relationship 14)}$$

The estimate update equation for the error covariance matrix is defined by the following relationship:

$$P_{k|k} = (I - K_k \cdot H_k) \cdot P_{k|k-1}, \quad \text{Relationship 15)}$$

where I is the identity matrix.

The method for estimating the scale and offset coefficients begins with a step 100 of initializing the estimation algorithm. In step 100, if the value of the indicator $I_{CF}$ is equal to zero, the initial state vector $X_0$ is defined by the following relationship:

$$X_0 = [a_{x0} a_{y0} a_{z0} Off_{x0} Off_{y0} Off_{z0}]^T, \quad \text{Relationship 16)}$$

where:
- the coefficients $a_{x0}$, $a_{y0}$, $a_{z0}$ are equal to $1/e_{x0}$, $1/e_{y0}$ and $1/e_{z0}$, respectively, where $e_{x0}$, $e_{y0}$ and $e_{z0}$ are the default values 32 of the scale coefficients associated with the axes $x_b$, $y_b$ and $z_b$, respectively;
- the coefficients $Off_{x0}$, $Off_{y0}$, $Off_{z0}$ are equal to $-a_{x0} \cdot d_x$, $-a_{y0} \cdot d_y$ and $-a_{z0} \cdot d_z$, respectively, where $d_x$, $d_y$ and $d_z$ are the default values 32 of the offset coefficients associated with the axes $x_b$, $y_b$ and $z_b$, respectively.

The initial error covariance matrix $P_0$ is defined by the following relationship:

$$P_0^{Default} = \begin{bmatrix} \sigma_{scale0}^2 & & & & & \\ & \sigma_{scale0}^2 & & & & \\ & & \sigma_{scale0}^2 & & & \\ & & & \sigma_{Off0}^2 & & \\ & & & & \sigma_{Off0}^2 & \\ & & & & & \sigma_{Off0}^2 \end{bmatrix} \quad \text{Relationship 17)}$$

where:
- $P_0^{Default}$ is equal to the matrix $P_0$; and
- the coefficients $\sigma_{scale0}^2$ and $\sigma_{Off0}^2$ define the default uncertainty in the estimate of the coefficients $a_x$, $a_y$ and $a_z$ and of the coefficients $Off_x$, $Off_y$ and $Off_z$, respectively. By way of illustration, the coefficients $\sigma_{scale0}$ and $\sigma_{Off0}$ are equal to 0.1 and 100 μT, respectively.

If, in step 100, the value of the indicator $I_{CF}$ is higher than or equal to one, the vector $X_0$ and the matrix $P_0$ are taken as equal to the last vector $X_{k|k}$ and to the last matrix $P_{k|k}$, respectively, that were established in the preceding period of activity.

Next, for each new measurement from the magnetometer 30 acquired by the computer 20, the following operations are performed.

In an operation 102, the error covariance matrix $P_{k+1|k}$ is estimated using relationship 6).

In an operation 104, the coefficients of the matrix $H_k$ are updated according to the last estimate of the orientation of the vehicle 2. More specifically, it is the rotation matrix $C_n^b$ which is updated according to this last estimate of the orientation. Next, the components $B_{0,x}^b$, $B_{0,y}^b$ and $B_{0,z}^b$ are calculated by multiplying the vector $B_0^n$ by the updated matrix $C_n^b$. Lastly, still in operation 104, the innovation $Y_k$ and the innovation covariance matrix $S_k$ are calculated using relationships 10) and 11), respectively.

Preferably, in an operation 106, test 3) is performed immediately after calculating the new coefficients $\sigma_{Y_x}^2$, $\sigma_{Y_y}^2$ and $\sigma_{Y_z}^2$ of the matrix $S_k$. This makes it possible to avoid pointlessly performing the next operation.

Only if test 3) is passed, then, in an operation 108, the gain $K_k$, the vector $X_{k|k}$ and the matrix $P_{k|k}$ are calculated using relationships 13), 14) and 15), respectively. On the basis of the components of the vector $X_{k|k}$, the new values of the scale coefficients $e_x$, $e_y$ and $e_z$ and the new values of the offset coefficients $d_x$, $d_y$ and $d_z$ are updated using the relationships introduced with reference to relationship 3).

SECTION II: VARIANTS

Variants of the Field $B_0$:

The initial position for obtaining the vector $B_0$ on starting a new period of activity may be provided by a system other than the satellite geolocation unit 10. For example, if the system 6 is usually stationary during the periods of inactivity, the position of starting the new period of activity is taken as equal to the last position estimated in the preceding period of activity.

In another embodiment and assuming that the location system remains stationary between two successive periods of activity, the last vector $B_0$ used in the preceding period of use is stored. Next, at the beginning of the subsequent period of activity, it is this vector $B_0$ stored in the preceding period of activity which is used. This makes it possible not to have to update the vector $B_0$ on the basis of the position measured by the unit 10 while movements of the vehicle 2 in the present period of activity remains insubstantial.

In one simplified embodiment, whatever the position of the vehicle 2, the norm of the vector $B_0$ is considered to be constant. In this case, the model 38 may be simplified by storing only the data needed to determine the direction of the vector $B_0$ according to the position, without it being necessary to determine the norm of this vector $B_0$. Operations 56 and 58 may therefore be omitted.

In the particular case in which the vehicle includes a metal or magnetic mass that is systematically stationary relative to the system 6 and which modifies the direction of the geomagnetic field which passes through the magnetometer 30, this interference in the geomagnetic field may be directly incorporated within the model 38.

Variants of the Algorithm for Estimating the Scale and Offset Coefficients:

Other choices are possible for the initial state vector $X_0$ when the indicator $I_{CF}$ is equal to zero. For example, as a variant, the vector $X_0$ is chosen to be equal to $[1\ 1\ 1\ 0\ 0\ 0]^T$.

In certain cases, the value of the scale coefficient of a measurement axis of the magnetometer 30 is also non-negligibly dependent on the components of the magnetic field measured on other measurement axes. In this case, the matrix A is not a diagonal matrix and the coefficients of the matrix A which are not located on its diagonal must also be estimated. For this, the state vector $X_k$ is expanded so as to include the nine coefficients of the matrix A instead of only the three coefficients $a_x$, $a_y$ and $a_z$ of the diagonal. The various equations of the linear Kalman filter must by adjusted accordingly.

As a variant, the common reference frame in which the vector $B_{raw}$ is compared with the vector $B_0$ is a reference frame other than the reference frame $R_b$. For example, the common reference frame is the reference frame $R_T$. In this case, the estimated orientation of the vehicle is used to construct a rotation matrix which allows the components of the vector $B_{raw}$, which are expressed in the reference frame $R_b$, to be converted into components expressed in the terrestrial reference frame $R_T$. The algorithm for estimating the scale and offset coefficients must then be adjusted in order to account for the fact that the common reference frame is the reference frame $R_T$ and not the reference frame $R_B$. Potentially, the common reference frame may also be a third reference frame other than the reference frames $R_b$ and $R_T$ from the moment when it is possible to construct, on the basis of the determined orientation of the vehicle 2, rotation matrices which allow the vectors $B_{raw}$ and $B_0$ to be expressed in this common reference frame.

Here, the scale and offset coefficients are established so as to minimize the difference between the vector $B_C$ and the vector $B_0^b$. For this, the estimation algorithm has been described in the particular case in which it is a linear Kalman filter. However, any other estimation algorithm allowing the same problem to be solved may be used. As examples of other usable estimation algorithms, the following algorithms may be mentioned: an extended Kalman filter, a particle filter, the recursive least squares (RLS) algorithm, a maximum likelihood estimator or any other deterministic estimator.

If the movements of the vehicle 2 since the last execution of operation 58 are insubstantial enough to be able to assume that they will not cause any significant change in the vector $B_0$, then, as long as this condition is met, the vector $B_0$ is not recalculated during the execution of the calibration phase 80. Conversely, if the measured movements of the vehicle 2 are substantial enough to correspond to a significant change in the vector $B_0$, then, in phase 80, operation 58 is performed again while this time taking the position currently estimated by the module 26 into account. Thus, the reference vector used in phase 80 is not necessarily the same as that used in phase 48.

Variant of the Various Tests Described:

Other embodiments of test 1) are possible. For example, if a vehicle is moving systematically horizontally, only the accuracy in the measurement of the yaw angle is tested and once this is high enough, the calibration of the magnetometer 30 is updated without taking the accuracy in the measurement of the roll and pitch angles into account. Thus, as a variant, test 1) is replaced with a test in which only the standard deviation $\sigma_\psi$ is compared with the threshold $S_1$.

In another variant, the standard deviations $\sigma_\psi$, $\sigma_\theta$ are $\sigma_\varphi$ are each compared with different predetermined thresholds.

Test 1) may be modified to use, instead of the standard deviations $\sigma_\psi$, $\sigma_\theta$ and $\sigma_\varphi$, the variances in the estimates of the yaw, pitch and roll angles.

As a variant, a value strictly greater than zero is assigned to the indicator $I_{CF}$ only if all of conditions 6.1 to 6.6 are met. This variant is useful in particular for vehicles that are liable to exhibit a substantial slope with respect to the vertical on starting up the system 6. Specifically, in this case, the yaw angle is also heavily dependent on the accuracy of the measurement from the magnetometer along the measurement axis $z_b$. For example, this variant is useful if the vehicle is a missile on a launch ramp.

Step 82 may include more or fewer tests. For example, in one highly simplified embodiment, only test 1) is implemented in step 82. In another embodiment, additional tests are implemented in step 82. For example, a test for the accuracy of the estimate of the position of the vehicle 2 is implemented in order to trigger the calibration of the magnetometer 30 only if the position is known with sufficiently high accuracy. It is also possible to add a test which verifies that the norm of the vector $B_{raw}$ is above a predetermined threshold so as to prevent the current values 34 from being updated in the presence of an insufficiently strong geomagnetic field. Such a situation may be encountered, for example, in the presence of a disruptor which generates a field with an intensity that is substantially equal to that of the geomagnetic field but in an opposite direction.

Other embodiments of test 5) are also possible. For example, test 5) is modified to verify in addition that the new estimates of the values of the offset coefficients are located within predetermined possible ranges of values. In another simplified embodiment, test 5) is omitted. In that case, the values of the scale and offset coefficients are not bounded. In another embodiment, if test 5) is not passed, instead of bounding the new estimates of the values of the scale coefficient, they are not modified but the value of the indicator $I_{CF}$ is taken as equal to zero.

Other embodiments of test 6) are possible. For example, if a sufficiently high accuracy in the coefficients $a_x$ and $a_y$ already guarantees a sufficiently accurate estimate of the yaw angle by itself, then test 6) may be simplified. For example, test 6) no longer includes conditions 6.1 and 6.2.

As a variant, step 86 of verifying the quality of the calibration is omitted. In this case, the value of the indicator $I_{CF}$ is systematically taken as equal to two after the execution of step 84.

Other Variants:

The system 6 described here may be used in other vehicles, such as a submarine. Generally speaking, the term "vehicle" used here refers to any object capable of moving and fitted with a system 6 fixed to this object for determining its position and orientation. For example, the vehicle may be a missile, a rocket, a smartphone, a portable computer or the like.

The magnetometer 30 may be incorporated within the inertial navigation unit 12. It may also be a component independent of the unit 12 and attached mechanically to the unit 12 and to the satellite geolocation unit 10.

The system 6 may include additional sensors in order to improve the accuracy with which the position and orientation of the vehicle are determined still further. For example, the system 6 may include:
  a pressure sensor so as to determine the altitude of the vehicle better; and/or
  an odometer, such as a pedometer, which measures the distance covered by the vehicle 2 between two successive times.

Other embodiments of the magnetometer 30 are possible. For example, in the case of a vehicle 2 moving only horizontally, the magnetometer 30 may be replaced with a biaxial magnetometer, i.e. a magnetometer including only two, horizontal measurement axes. In other embodiments, the magnetometer 30 is replaced with a magnetometer including more than three non-collinear measurement axes. In this last case, some of the measurements are redundant, which may be used to increase the measurement accuracy.

In step 56, the initial estimate of the position of the vehicle may be produced differently. For example, this initial estimate is produced by taking into account, in addition to or instead of the measurements from the unit 10, the measurements from other sensors on board the vehicle or the measurements from the unit 12 and/or from the magnetometer 30.

In step 60, producing the initial estimate of the yaw angle on the basis of the vectors $B_c$ and $B_0$ makes it possible to obtain a more accurate initial estimate of the yaw angle than if only the vector $B_c$ were used. However, as a variant, it is also possible to use only the vector $B_c$ to produce the initial estimate of the yaw angle. For example, the initial estimate of the yaw angle is produced using the following relationship: $\psi_{ini}=\text{atan2}(B_{cx}, B_{cy})$, where:
  $\psi_{ini}$ is the initial estimate of the yaw angle; and
  $B_{cx}$ and $B_{cy}$ are the values of the magnetic field $B_c$ which are measured along the axes $x_b$ et $y_b$, respectively, of the reference frame $R_b$;
  "atan2" is the known variant of the arctangent function such as defined, for example, on Wikipedia.

This relationship is applicable under the following conditions:
  the measurement axes of the magnetometer 30 are parallel to the axes $x_b$, $y_b$ and $z_b$, respectively, of the reference frame $R_b$ on board the vehicle;
  the axis $x_b$ runs parallel to the direction in which the vehicle moves when moving forward in a straight line;
  the axis $y_b$ of the magnetometer points to the left of the vehicle when it is moving forward;
  the axis $z_b$ is vertical and points upward.

The initial estimate of the yaw angle using this relationship is quite accurate when the vehicle is located on a horizontal plane. In the case that the vehicle is not located on a horizontal place, known techniques using the measurements from the accelerometer 14 make it possible to obtain the projection of the measurements from the magnetometer 30 in the horizontal plan and then to use the relationship above. Such techniques are, for example, described in the book by Groves cited above.

Numerous other different embodiments of the merge algorithm exist. For example, in one particular embodiment, the new measurements from the magnetometer 30 are also taken into account in order to establish each new estimate of the position and of the orientation of the vehicle 2. If the system 6 includes other sensors such as a pressure sensor or an odometer, then the merge algorithm is also modified to take the measurements from these other sensors into account too.

As a variant, the data pre-recorded in the memory 24 between two successive periods of activity are only the values of the coefficients $a_x$, $a_y$, $a_z$, $\text{Off}_x$, $\text{Off}_y$ and $\text{Off}_z$. In this case, in operation 54, the current values of the scale and offset coefficients are first calculated from the coefficients $a_x$, $a_y$, $a_z$, $\text{Off}_x$, $\text{Off}_y$ and $\text{Off}_z$ pre-recorded in the memory 24.

The feature according to which the scale and offset coefficients of the magnetometer 30 are updated only if no magnetic disruptor is located in proximity to the magnetometer may be implemented independently of test 1). For example, in another embodiment, in step 82, test 2) or 3) is implemented and test 1) is omitted.

SECTION III: ADVANTAGES OF THE DESCRIBED EMBODIMENTS

Triggering the updating of the current values 34 of the scale and offset coefficients only when the margin of error in the estimate of the orientation of the vehicle 2 is smaller than the threshold $S_1$ makes it possible to avoid the calibration of the magnetometer 30 being negatively affected due to overly large errors in this estimate of the orientation of the vehicle 2. The reliability of magnetometer 30 calibration is therefore improved. This improvement results in the initial estimate of the yaw angle at the beginning of a subsequent period of activity being better, which then speeds up the convergence of the merge algorithm towards more accurate estimates of the position and of the orientation of the vehicle 2. Moreover, in the embodiment described, the updating of the scale and offset coefficients is straightforward to implement. In particular, it may be implemented while the vehicle 2 is moving and does not require the vehicle 2 to move or to perform predetermined movements in advance.

Allowing the scale and offset coefficients to be updated only if test 3) is passed makes it possible to avoid such an update being performed in the presence of a magnetic disruptor. This contributes to increasing the reliability of magnetometer calibration on starting a subsequent period of activity.

Taking the standard deviation into account in test 3) allows this test 3) to be automatically adjusted so that the threshold $S_3$ is not exceeded in the presence of just usual noise in the measurement from the magnetometer 30. This contributes to increasing the reliability of detection of a disruptor in proximity to the magnetometer 30 and hence the reliability of magnetometer calibration.

Test 4) makes it possible to avoid performing operation 84 pointlessly. Moreover, this decreases the risk of the scale and offset coefficients, which were determined in a situation in which the yaw angle does not vary, being able to diverge and negatively affect the calibration of the magnetometer 30.

Calculating the vector $B_0$ according to the estimated position of the vehicle makes it possible to account for the fact that the norm of the terrestrial geomagnetic field is not perfectly uniform at every point on the earth. This improves the accuracy of the magnetometer 30 calibration and hence the speed with which the merge algorithm converges toward a more accurate estimate of the position and of the orientation of the vehicle 2.

Calculating a margin of error in the estimate of at least one of the scale and offset coefficients and putting the use of this new estimate of the scale and offset coefficients on hold for as long as this margin of error is too high makes it possible to avoid using insufficiently accurate scale and offset coefficients in order to guarantee a reliable estimate of the yaw angle.

The invention claimed is:

1. A method for determining a position and an orientation of a vehicle, said method comprising:
    providing a location system fixed to said vehicle, said location system including a satellite geolocation unit, an inertial navigation unit including an accelerometer and a gyrometer, and a magnetometer including at least two measurement axes;
    measuring, with the magnetometer, a first raw-measurement vector containing a raw component for each of the at least two measurement axes, each component encoding an amplitude and a direction of an orthogonal projection of a magnetic field that passes through said magnetometer on a respective measurement axis of the at least two measurement axes, the at least two measurement axes being fixed in a triaxial moving reference frame fixed to the vehicle;
    correcting each raw component of the raw components of the first raw-measurement vector by multiplying the raw component by a scale coefficient and by adding an offset coefficient thereto to obtain a corrected component, the scale coefficient and the offset coefficient being obtained from pre-recorded data in a memory of the location system;
    initially estimating a yaw angle of the vehicle based on the corrected components of the first vector to obtain an initial estimate of the yaw angle;
    initializing, using the initial estimate of the yaw angle, a merge algorithm to determine, based on preceding estimates of the position and of the orientation of the vehicle and by using both measurements from the satellite geolocation unit and measurements from the inertial navigation unit taken since the preceding estimates: (1) a current estimate of the position and a current estimate of the orientation of the vehicle, and (2) a margin of error in said current estimate of the orientation of the vehicle; and
    repeatedly running said merge algorithm to continuously update the current estimate of the position and the current estimate of the orientation of the vehicle,
    wherein, after a start of the repeated running of the merge algorithm and in parallel to the repeated running of the merge algorithm, the method further comprises a calibration phase including the following operations:
    (1) measuring, with the magnetometer, a second raw-measurement vector;
    (2) obtaining a reference vector including a component for each measurement axis, each component encoding an amplitude and a direction of an orthogonal projection of a geomagnetic field that passes through the magnetometer on a respective measurement axis of a fixed triaxial terrestrial reference frame with no degree of freedom with respect to the earth, the components of the obtained reference vector being obtained from a pre-recorded model of the geomagnetic field and not measured by the magnetometer; and
    (3) only when the margin of error in the current estimate of the orientation of the vehicle is below a first predetermined threshold, updating the pre-recorded data from which the scale coefficient and the offset coefficient are obtained, said updating being performed using the second raw-measurement vector, the reference vector, and the current estimate of the orientation of the vehicle so as to decrease a difference between corrected components of the second raw-measurement vector and the components of the reference vector when all of the components are expressed in a common reference frame.

2. The method as claimed in claim 1, wherein the calibration phase further comprises:
    calculating a difference between raw components of the second raw-measurement vector and an estimate of the components that are obtained from the reference vector and from the current estimate of the orientation of the vehicle;
    comparing the calculated difference with a second predetermined threshold; and
    when the calculated difference exceeds said second threshold, operation (3) is put on hold and, once the calculated difference does not exceed said second threshold, operation (3) is performed.

3. The method as claimed in claim 2, wherein the calibration phase further comprises calculating a standard deviation of the calculated difference and comparing the calculated difference, weighted according to said calculated standard deviation, with the second predetermined threshold.

4. The method as claimed in claim 1, wherein the calibration phase further comprises:
    calculating a difference in orientation between an orientation of the vehicle in a preceding execution of the calibration phase and an orientation of the vehicle in a present execution of the calibration phase;
    comparing the calculated difference in orientation with a third predetermined threshold; and
    when the calculated difference in orientation does not exceed said third threshold, operation (3) is put on hold and, once the calculated difference in orientation does exceed said third threshold, operation (3) is performed.

5. The method as claimed in claim 1, wherein obtaining the reference vector further comprises calculating the components of the reference vector from:
   the current estimate of the position of the vehicle; and
   a pre-recorded model of the geomagnetic field that associates, with each possible position of the vehicle, components of the geomagnetic field at said position in the fixed triaxial terrestrial reference frame, said model incorporating local variations in the geomagnetic field.

6. The method as claimed in claim 1, wherein the calibration phase further comprises:
   establishing new values for the pre-recorded data from which the scale coefficient and the offset coefficient are obtained, the new values being calculated based on components of the second raw-measurement vector, the reference vector, and the current estimate of the orientation of the vehicle, and establishing the new values for the pre-recorded data also including calculation of at least one margin of error in one of the calculated new values;
   comparing said calculated margin of error with a fourth predetermined threshold; and
   when the calculated margin of error exceeds said fourth threshold, use of the calculated new values to calculate the scale coefficient and the offset coefficient is put on hold and, once the calculated margin of error does not exceed said fourth threshold:
      operation (3) is performed and the updated pre-recorded data are taken as equal to the calculated new values; and
      using the calculated new values to calculate the scale coefficient and the offset coefficient is performed.

7. The method as claimed in claim 1, wherein the calibration phase further comprises:
   establishing, based on the current estimate of the orientation of the vehicle, components of a rotation matrix that allows a change in reference frame from the fixed triaxial terrestrial reference frame to the triaxial moving reference frame;
   multiplying the reference vector by the rotation matrix to obtain a new reference vector, the components of which are expressed in the triaxial moving reference frame, said moving reference frame then forming the common reference frame.

8. The method as claimed in claim 1, wherein the calibration phase further comprises:
   comparing the margin of error in the current estimate of the orientation of the vehicle with the first threshold; and
   when the margin of error in the current estimate of the orientation of the vehicle exceeds said first threshold, operation 3 is put on hold and, once the margin of error in the current estimate of the orientation does not exceed said first threshold, operation (3) is performed.

9. A non-transitory information storage medium, readable by a microprocessor, wherein said medium comprises instructions for performing the calibration phase of calibrating the magnetometer in the method for determining the position of the vehicle and the orientation of the vehicle as claimed in claim 1, when the instructions are executed by the microprocessor.

10. A location system, configured to be fixed to a vehicle, for determining the position and orientation of said vehicle, said location system including:
   a satellite geolocation unit;
   an inertial navigation unit containing an accelerometer and a gyrometer; and
   a magnetometer including at least two measurement axes, said location system being configured to:
   measure, by the magnetometer, a first raw-measurement vector containing a raw component for each of the at least two measurement axes, each component encoding an amplitude and a direction of an orthogonal projection of a magnetic field that passes through said magnetometer on a respective measurement axis of the at least two measurement axes, the at least two measurement axes being fixed in a triaxial moving reference frame fixed to the vehicle;
   correct each raw component of the raw components of the first raw-measurement vector by multiplying the raw component by a scale coefficient and by adding an offset coefficient thereto to obtain a corrected component, the scale coefficient and the offset coefficient being obtained from pre-recorded data in a memory of the location system;
   produce an initial estimate of a yaw angle of the vehicle based on the corrected components of the first vector;
   initialize, using the initial estimate of the yaw angle, a merge algorithm configured to establish, based on preceding estimates of the position and of the orientation of the vehicle and by using both measurements from the geolocation unit and measurements from the inertial navigation unit taken since the preceding estimates: (1) a current estimate of the position and a current estimate of the orientation of the vehicle, and (2) margin of error in said current estimate of the orientation of the vehicle; and
   run said merge algorithm repeatedly to continuously update the current estimate of the position and the current estimate of the orientation of the vehicle,
   wherein the system comprises a calibration module configured to, after a start of the repeated running of the merge algorithm and in parallel to the repeated running of the merge algorithm, perform:
   (1) acquiring the measurement, by the magnetometer, of a second raw-measurement vector;
   (2) obtaining a reference vector including a component for each measurement axis, the component encoding an amplitude and a direction of an orthogonal projection of a geomagnetic field that passes through the magnetometer on a respective axis of a fixed triaxial terrestrial reference frame with no degree of freedom with respect to the earth, the components of the obtained reference vector being obtained from a pre-recorded model of the geomagnetic field and not measured by the magnetometer; and
   (3) only when the margin of error in the current estimate of the orientation of the vehicle is below a first predetermined threshold, updating the pre-recorded data from which the scale coefficient and the offset coefficient are obtained, said updating being performed using the second raw-measurement vector, the reference vector, and the current estimate of the orientation of the vehicle so as to decrease a difference between corrected components of the second raw-measurement vector and the components of the reference vector when all of the components are expressed in a common reference frame.

* * * * *

UNITED STATES PATENT AND TRADEMARK OFFICE
CERTIFICATE OF CORRECTION

| | | |
|---|---|---|
| PATENT NO. | : 11,519,730 B2 | Page 1 of 1 |
| APPLICATION NO. | : 16/845144 | |
| DATED | : December 6, 2022 | |
| INVENTOR(S) | : Villien | |

It is certified that error appears in the above-identified patent and that said Letters Patent is hereby corrected as shown below:

On the Title Page

On Page 2, Column 2, Item (56), under "OTHER PUBLICATIONS", Line 33, delete "Gryo" and insert -- Gyro --, therefor.

In the Claims

In Column 22, Claim 10, Line 33, after "(2)" insert -- a --.

Signed and Sealed this
Twenty-seventh Day of June, 2023

*Katherine Kelly Vidal*

Katherine Kelly Vidal
*Director of the United States Patent and Trademark Office*